(12) United States Patent
Hill

(10) Patent No.: US 8,471,642 B2
(45) Date of Patent: Jun. 25, 2013

(54) RESONANT CIRCUITS

(75) Inventor: Nicholas Patrick Roland Hill, Cambridge (GB)

(73) Assignee: Cambridge Resonant Technologies Ltd., Cambridge (GB)

( * ) Notice: Subject to any disclaimer, the term of this patent is extended or adjusted under 35 U.S.C. 154(b) by 740 days.

(21) Appl. No.: 12/086,509

(22) PCT Filed: Dec. 7, 2006

(86) PCT No.: PCT/GB2006/050436
§ 371 (c)(1),
(2), (4) Date: Sep. 7, 2010

(87) PCT Pub. No.: WO2007/068974
PCT Pub. Date: Jun. 21, 2007

(65) Prior Publication Data
US 2011/0025410 A1    Feb. 3, 2011

Related U.S. Application Data

(60) Provisional application No. 60/758,551, filed on Jan. 13, 2006, provisional application No. 60/758,560, filed on Jan. 13, 2006.

(30) Foreign Application Priority Data

Dec. 16, 2005  (GB) .................................. 0525622.7
Dec. 16, 2005  (GB) .................................. 0525624.3

(51) Int. Cl.
*H03K 3/282* (2006.01)
(52) U.S. Cl.
USPC ................. 331/117 R; 331/117 FE; 331/175; 327/553

(58) Field of Classification Search
USPC .................... 331/107 A, 117 R, 117 FE, 167, 331/175, 176, 179; 332/102, 109, 110; 327/553
See application file for complete search history.

(56) References Cited

U.S. PATENT DOCUMENTS 5,491,715 A   2/1996   Flaxl
6,044,795 A   4/2000   Matsuura
(Continued)

FOREIGN PATENT DOCUMENTS

EP   1589656 A1   10/2005
GB   2381180 A    4/2003
(Continued)

OTHER PUBLICATIONS

European Search Report & Written Opinion from co-pending Application EP10187234, completion date Jan. 26, 2011.
European Search Report & Written Opinion from co-pending Application EP10187234, completion date Jan. 21, 2011.

*Primary Examiner* — Joseph Chang
*Assistant Examiner* — Jeffrey Shin
(74) *Attorney, Agent, or Firm* — Wolf, Greenfield & Sacks, P.C.

(57) ABSTRACT

Embodiments of the invention relate to resonant circuits; particularly but not exclusively the embodiments relate to resonant circuits in RPID (radio frequency identification) responsive to a wide frequency range. A controllable electric resonator comprising an inductor coupled to a first capacitor to form a resonant circuit, the resonator further comprising a controllable element, a second capacitor controllable coupled across said first capacitor by said controllable element, and a control device to control said controllable element such that a total effective capacitance of said first and second capacitor varies over a duty cycle of an oscillatory signal on said resonator.

29 Claims, 13 Drawing Sheets

U.S. PATENT DOCUMENTS

| | | | |
|---|---|---|---|
| 6,229,443 B1 * | 5/2001 | Roesner | 340/572.1 |
| 6,650,226 B1 | 11/2003 | Wuidart | |
| 6,772,011 B2 * | 8/2004 | Dolgin | 607/61 |
| 2003/0006880 A1 | 1/2003 | Zimmer | |
| 2003/0057279 A1 * | 3/2003 | Uozumi et al. | 235/451 |

FOREIGN PATENT DOCUMENTS

| | | |
|---|---|---|
| WO | WO 95/35609 A1 | 12/1995 |
| WO | WO 98/01837 A1 | 1/1998 |
| WO | WO 2005/104022 A1 | 11/2005 |

\* cited by examiner

RESONANT CIRCUITS

FIELD OF INVENTION

Broadly, the invention relates to resonant circuits. Embodiments of the invention relate particularly but not exclusively to resonant circuits in RFID (radio frequency identification) responsive to a wide frequency range. Embodiments of the invention also relate to low power proximity detection of an RFID (radio frequency identification) transponder.

BACKGROUND TO THE INVENTION

In an RFID system resonant circuits are generally used in both the reader and the transponder. Their use increases the efficiency of energy transfer between the two circuits, which would otherwise be much lower, severely limiting the range of operation. Optimal read range may be achieved when the reader is stimulated at its resonance frequency, and this also matches the resonant frequency of the transponder. The task of operating both these units at their resonant frequencies is complicated by the following factors:

1) The LC manufactured components have tolerances on their values, and the resonant frequency will vary between different examples of nominally identical resonant systems.
2) Temperature can change the value of the components, making the resonance frequency drift over time and environment.
3) Metallic or magnetic objects placed in the vicinity of either antenna can change their inductance and therefore change the resonant frequency.
4) The desired resonant frequency can change, for example the regulatory frequency band can change across national boundaries.

The impact of these complications increases with the Q of the two resonances. As the Q increases then the resonance bandwidth drops proportionally and a closer match between the two frequencies is required for efficient power transfer. Such constraints may limit the Q of the two circuits to relatively low levels, which may in turn limit the read range and/or lead to excessive power requirements.

In RFID systems one approach to mitigate some of these complications is to use a tuning circuit. A large number of different tuning variants have been disclosed in the prior art, however they have some common features. In order to tune the resonance frequency then either an electrically tunable component, such as a varactor or electrically variable inductor, or more commonly a combination of discrete capacitors or inductors are coupled into the resonance. An exemplary reference is U.S. Pat. No. 6,317,027, where a set of tuning capacitors in binary weighting are selectively coupled into the reader resonance with corresponding variations in the resonance frequency.

The adjustment may be carried out in a tuning cycle separate from the normal read and/or write operations. U.S. Pat. No. 6,317,027 is an example of such an approach, where a sweep of the tuning capacitance is carried out and the resonance amplitude profile determined; the chosen tuning capacitance achieves the maximum amplitude in the reader antenna. Alternatively U.S. Pat. No. 5,491,715 discloses a method based on the phase difference between the stimulus and the resonance to determine how far from resonance the reader circuit is.

These prior art methods to tune a system to resonance at a desired frequency have some significant drawbacks, which are now outlined.

The tuning circuit can require many components, comprising the set of capacitors and the switches to couple them into the resonance; this adds to the system complexity and cost. If fine control over the frequency is required then the selectable capacitors are required at high accuracy in order to achieve a monotonic setting of the total tuning capacitance. Such constraints can limit the feasible tuning accuracy and resolution.

The tuning is not generally real-time. If it is made real-time, such as the method described in U.S. Pat. No. 5,491,715, then this adds complexity and cost. Real-time control is beneficial to cope with transient de-tuning effects such as temperature drift and metallic objects coming into range.

These prior art tuning methods are generally applied to the reader antenna only. A transponder is required to have its natural resonance close to the radio frequency energising field in order to obtain its power. If significantly de-tuned, then the transponder would not be able to charge up enough to run a tuning circuit. As such, the prior art tuning methods described are usually unsuitable for a passive transponder.

Because of tight cost and power constraints it is more common that transponders are set up at manufacture with a fixed tuning to their target operating. This fixed tuning step adds to the cost of manufacture and cannot adjust to environmental changes that might affect the transponder resonant frequency.

A further transponder consideration is that it may be advantageous for a single transponder to be able to respond to a range of frequencies. One application example is the use of the same transponder across borders with different regulatory operating bands. If the transponders may respond to the different frequencies permitted in each region without a re-tuning step then this facilitates international travel, a key requirement in the common RFID application of asset tracking. Prior art methods provide no facility for this.

Further prior art may be found in U.S. Pat. No. 2,774,060, U.S. Pat. No. 3,818,472, U.S. Pat. No. 6,476,708, and GB2278631, WO2005/104022, US2004/0214549, GB2321726, U.S. Pat. No. 3,842,246, GB2087564, GB1206925.

SUMMARY OF THE INVENTION

We will describe an LC circuit that is responsive to a range of stimulus frequencies without the requirement for control of a tuning circuit. In embodiments the circuit is able to adjust naturally to external environmental influences without additional control mechanisms. In embodiments the circuit requires only a small number of low tolerance electrical components.

Rather than using a range of capacitors that are fully coupled into the resonance i.e. 100% duty cycle, in embodiments an alternative approach is taken where the LC resonance comprises a primary capacitive path and one or more secondary capacitive paths that are coupled into the resonance with a variable duty cycle. Depending on the duty cycle, the resonance matches a different stimulus frequency.

In embodiments the duty cycle is set by a switching element, more particularly a FET with a source potential that varies with the resonance amplitude. The charge required to turn the FET on or off is supplied by the resonance current in the inductor; it is therefore efficient and does not require an external power source; as such the method may have application both in a reader and also a transponder. If implemented in a transponder then the transponder will be responsive to a range of energising frequencies, potentially allowing operation across locations with different regulatory frequencies.

The duty cycle is determined both by the resonance amplitude and also the FET gate voltage. The resonance amplitude may be conveniently controlled with the FET gate voltage, which through the relative phase of the resonance and stimulus sets the steady state amplitude. The amplitude may be straightforwardly controlled up to a maximum level corresponding to that of an antenna circuit matched to the stimulus frequency with the same Q. At this maximum level the resonance is in phase with the stimulus.

In high coupling situations a transponder may include a regulator to limit the pickup voltage and avoid damage to the rest of the circuitry. However such a transponder can pickup a significant proportion of the energising field, which is subsequently dissipated as heat in the regulator. Embodiments of the transponder we describe limit the pickup voltage through the relative phase between the pickup voltage and the energising field. The level of pickup is limited in the high coupling case, which can avoid issues with the transponder shading the energising field. This can be beneficial when reading multiple transponders.

In embodiments the reader and/or the transponder may be tolerant to a degree of detuning due to the environment. For example a metallic element placed close to the antenna will modify its inductance. However, provided the desired operating frequency is still encompassed in the frequency range over which the resonance is responsive then the system will continue to operate normally. This offers an improvement relative to the prior art where such environmental changes are generally only corrected in the reader and require a separate control/measurement process.

In a first aspect of the invention there is therefore provided a controllable electric resonator comprising an inductor coupled to a first capacitor to form a resonant circuit, the resonator further comprising a controllable element, a second capacitor controllable coupled across said first capacitor by said controllable element, and a control device to control said controllable element such that a total effective capacitance of said first and second capacitor varies over a duty cycle of an oscillatory signal on said resonator.

In some preferred embodiments the controllable device comprises a switching element such as a transistor, more particularly a field effect transistor such as a MOS (metal oxide semiconductor) transistor, and a control device comprises a bias circuit for the transistor. Preferably the bias circuit is configured to automatically adjust the bias from the transistor to increase an amplitude of the oscillatory signal. Optionally the resonator may include a power supply circuit to derive a power supply for said bias circuit from said oscillatory signal.

In embodiments the resonator includes a third capacitor connected across the controllable element; preferably the inductor has a Q of greater than 50, more preferably greater than 100. The resonator preferably includes a drive system to drive the oscillatory signal on the resonator; this may include means for converting a current drawn by the resonator into a pulse having a duration depending on the current.

The invention further provides an RFID tag or tag reader including a resonator as described above.

In a related aspect the invention provides a method of controlling the amplitude of oscillations in a resonant circuit driven by an oscillatory signal, the method comprising: applying a reactive element to said resonant circuit with a variable coupling; varying said coupling over a cycle of said oscillatory signal to control said amplitude of oscillations.

The invention further provides apparatus for controlling the amplitude of oscillations on a resonant circuit driven by an oscillatory signal, the apparatus comprising: means for applying a reactive element to said resonant circuit with a variable coupling; and means for varying said coupling over a cycle of said oscillatory signal to control said amplitude of oscillations.

The invention still further provides a method of controlling a resonant frequency of a resonant circuit to substantially match said resonant frequency to a frequency of an external waveform, the resonant circuit comprising an inductance coupled to a capacitance, the capacitance having a switched component of capacitance, the method comprising controlling a duty cycle of said switched component of capacitance, in response to a signal level of a waveform of an oscillation of said resonant circuit.

The inductance may be coupled in series and/or in parallel with the capacitance; preferably the switched component of capacitance includes a field effect transistor (FET) switch coupled (in series and/or parallel) to a switched capacitance. The duty cycle may be controlled by controlling a gate-source voltage of the FET in response to an instantaneous level of the waveform of an oscillation of the resonant circuit. In embodiments a relative phase of the waveform of this oscillation and of the external waveform changes in response to a signal level of the external waveform.

Thus, in embodiments, broadly speaking the amplitude of the waveform in the resonant circuit builds up and controls the gate-source voltage of the FET to bring the circuit towards resonance. When resonant oscillation has been established, broadly speaking the amplitude of the oscillatory waveform in a resonant circuit remains approximately constant but the relative phase of the "internal" waveform in the resonant circuit with respect to the external waveform changes in response to the strength of the external signal; and as previously mentioned the duty cycle depends upon the frequency of the external signal. Broadly speaking the relative phase measures the amount of energy extracted from the stimulating field. One advantage of this operation is that the circuit can operate over a very wide range of external field strengths and, for example, does not need an additional regulator when operating in close proximity to an rf source, that is in a high field.

In some embodiments of the method the external waveform comprises a waveform of an rf electromagnetic field (either propagating or near-field). Thus an embodiment of the above-described method is advantageous for extracting energy from an rf electromagnetic field, in embodiments the aforementioned relative phase adjusting to limit the extracted energy from the field as the field increases. (In embodiments the amplitude of the internal waveform is a function of the gate voltage of the FET, of component values, and of the resonant frequency).

In other embodiments of the method the external waveform may be derived from a crystal oscillator, either directly or indirectly (for example via microprocessor). Since in embodiments the circuit adjusts to the clock such a technique can be employed to provide a very low phase noise rf source.

In a related aspect the invention provides a circuit for controlling a resonant frequency of a resonant circuit to substantially match said resonant frequency to a frequency of an external waveform, the resonant circuit comprising an inductance coupled to a capacitance, the capacitance having a switched component of capacitance, the circuit comprising means for controlling a duty cycle of said switched component of capacitance in response to a signal level of a waveform of an oscillation of said resonant circuit.

Broadly speaking embodiments of the circuit are useful where very efficient coupling over a relatively wide range of frequencies is desirable. Embodiments of the circuit facilitate coupling between two high Q systems without the need for very precise alignment of the resonant peaks which would otherwise be necessary. This facilitates, for example, highly efficient inductive charging. Embodiments of the technique also facilitate the efficient operation of an rf tag over a plurality of frequencies or bands of operation, for example facilitating the provision of a single tag capable of operating in accordance with different US and European prescribed frequency standards (for example over the range 125 KHz to 134 KHz).

Thus the invention further provides an RFID tag comprising a controllable resonant circuit, the resonant circuit comprising an inductance coupled to a capacitance, the capacitance having a switched component of capacitance, wherein said controllable resonant circuit is configured to automatically control a duty cycle of said switched component of capacitance to select one of a plurality of frequencies of operation of said tag in response to an interrogating rf field.

The invention also provides an LC resonant circuit comprising an inductor, a primary capacitive path, and at least one other secondary capacitive path that is coupled into the resonance with a variable duty cycle; and wherein the circuit response frequency, which is dependent on the duty cycle, matches to a stimulus frequency.

The invention further provides a reader antenna tuning method in which the stimulus frequency is varied and the chosen frequency maximises the energy input into the antenna. The invention further provides a reader antenna tuning method where the stimulus frequency is varied and the chosen frequency minimises the threshold amplitude for transponder modulation. The invention further provides a reader antenna tuning method where the stimulus frequency is varied and the chosen frequency makes the modulation transformed transponder impedance resistive. In a reader as previously described the tuning frequency to match to the transponder may be taken from a low power proximity detector using a chirp decay to measure one or both of the transponder proximity and its resonant frequency. In embodiments the transponder is responsive to a range of frequencies.

A controllable electric resonator, resonant circuit, apparatus, tag or reader, or method as described above may be incorporated into one or more of the following: a transmitter; a receiver; a near-field communication device; an inductive charger; an inductively charged device such as a consumer electronics device; an oscillator; a voltage converter; a capacitive energy/information transfer system; and an energy harvesting device.

We also describe a low power detection method for the presence of a RFID transponder. The system may move into a full power identification mode when the presence of a transponder is detected.

Rather than a conventional LC reader antenna resonant circuit, these embodiments use a circuit that contains a non-linear element, such that the natural resonance frequency depends on amplitude. In response to a pulse excitation the reader antenna circuit generates a chirp signal that simultaneously decays with time and sweeps across a frequency range.

The antenna circuit is preferably significantly higher Q than the transponder such the decay of the chirp is relatively slow compared to the transponder response. In this manner there is still an appreciable duration of the antenna waveform when the transponder frequency is close to the chirp instantaneous frequency. When this occurs the transponder absorbs energy from the antenna, which is subsequently registered in the reader. This chirp method therefore need no longer require matching between the resonant frequency of the antenna and the transponder.

Embodiments employ a decaying chirp waveform that links the amplitude of the chirp to the frequency of the chirp. This waveform allows a more sensitive measurement of energy loss through the phase of the decaying waveform. Small changes in the energy absorbed from the antenna cause corresponding changes to the frequency of the decay, in addition to the amplitude. Comparing two levels of damping, once the two chirps are operating at different frequencies their phase difference increases with time. Consequently, after a delay of many cycles the small difference in damping between the two waveforms may be picked up by a straightforward sampling of the chirp waveform. The phase difference between the two waveforms, once it amounts to a significant fraction of a cycle, translates to a large fractional change in the sampled voltage. This is in contrast to an amplitude measurement, which would display a much smaller effect. Registering changes in damping through the phase of the chirp decay can potentially offer improved sensitivity.

The frequency sweep of the chirp decay may be used to determine the transponder resonant frequency. As the frequency sweeps over the transponder resonance, the effect of the transponder on the antenna is maximised. For the case where the chirp starts at low frequency and sweeps to a higher frequency then the effect of increasing the transponder resonant frequency is to delay the corresponding change to the chirp. Rather than sampling the chirp at one point only, sampling at a number of points along the length of the decay therefore provides information relating to the transponder resonance frequency. This measurement may either be carried out every time the chirp is generated, or alternatively a change in the system may be registered from a single point measurement and subsequently the transponder frequency determined from a multi-point measurement of the chirp. Once the transponder resonant frequency has been determined the antenna may be tuned accordingly for the subsequent full power identification mode. This multi-point measurement may also beneficially discriminate between a transponder with a clear resonance and interfering objects that absorb energy over a wide frequency range, for example metallic objects.

Thus there is also provided a resonant circuit with a non-linear element in it such that on pulsing it produces a chirp decay that links the amplitude to the decay. A measurement of phase is used to determine small differences due to the presence of an object. Preferably the circuit uses at least one FET and variable duty cycle of two capacitive branches in order to generate the chirp. Preferably the circuit uses a varactor or an electrically variable inductor as the nonlinear element that generates the chirp. The object to detect may be an RFID transponder, a passive resonant circuit, a metallic object; the object may be coupled inductively or capacitively. Averaging sequential samples may be used to track environmental changes or battery droop and/or to reduce noise interference. We also describe a cat flap or pet feeder with a built in RFID reader, where a low power mode is used to detect the presence of a cat prior to full power reading of a sub-dermal RFID chip.

BRIEF DESCRIPTION OF THE DRAWINGS

(In FIGS. 3, 7, 9, 10 and 12, although printing artefacts may appear, the areas within the signal envelopes should be solid because of the time scale on which the waveforms are depicted).

DETAILED DESCRIPTION OF EMBODIMENTS

Figure 1:
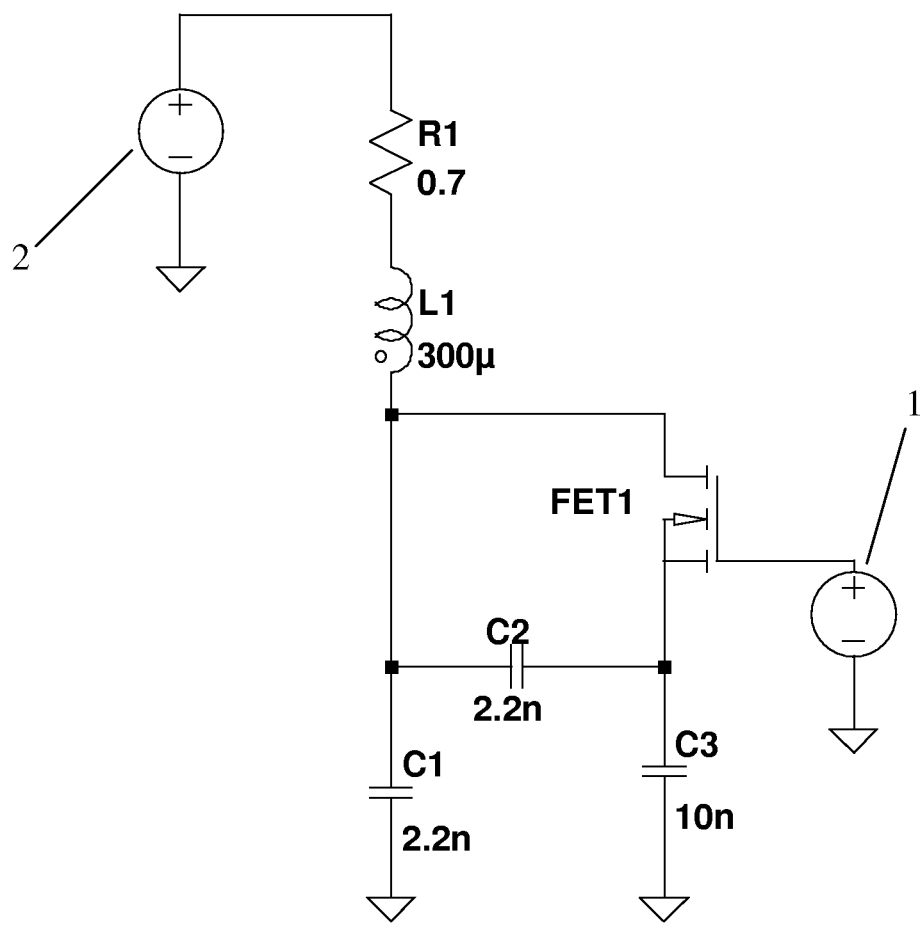
FIG. 1 is a schematic of a first embodiment of a resonant circuit.

The following description of a resonant circuit responsive to a wide frequency range is merely exemplary in nature and is in no way intended to limit the invention or its applications or uses. Those skilled in the art will recognise that in addition to the field of RFID it may equally well be applied in alternative fields benefiting from the properties of such a resonant circuit. These include (but are not limited to) the following:
1) radio transmitters and receivers, including mobile telephony
2) near field communications
3) inductive charging of devices
4) oscillators
5) voltage converters
6) capacitive energy/information transfer between systems
7) energy harvesting e.g. wirelessly from an electromagnetic source or within a circuit such as a mechanical pickup.

FIG. 1 shows a first embodiment of a resonant circuit according to an aspect of the invention. A high Q antenna comprises 32 turns of 660-strand 46AWG Litz wire, with overall diameter approximately 20 cm. Around the target operating frequency of 125 kHz the antenna has inductance 300 µH (L1) and effective series resistance 0.7Ω (R1), giving a Q of 340. The antenna is placed in series with the capacitor network C1, C2, C3 and an n-type FET. The FET gate voltage is controlled by the voltage source Vgate, 1, and the system is excited by the voltage source Vstimulus, 2. The operating principle is now described with reference to the current and voltage waveforms plotted in FIG. 2.

Figure 2A:
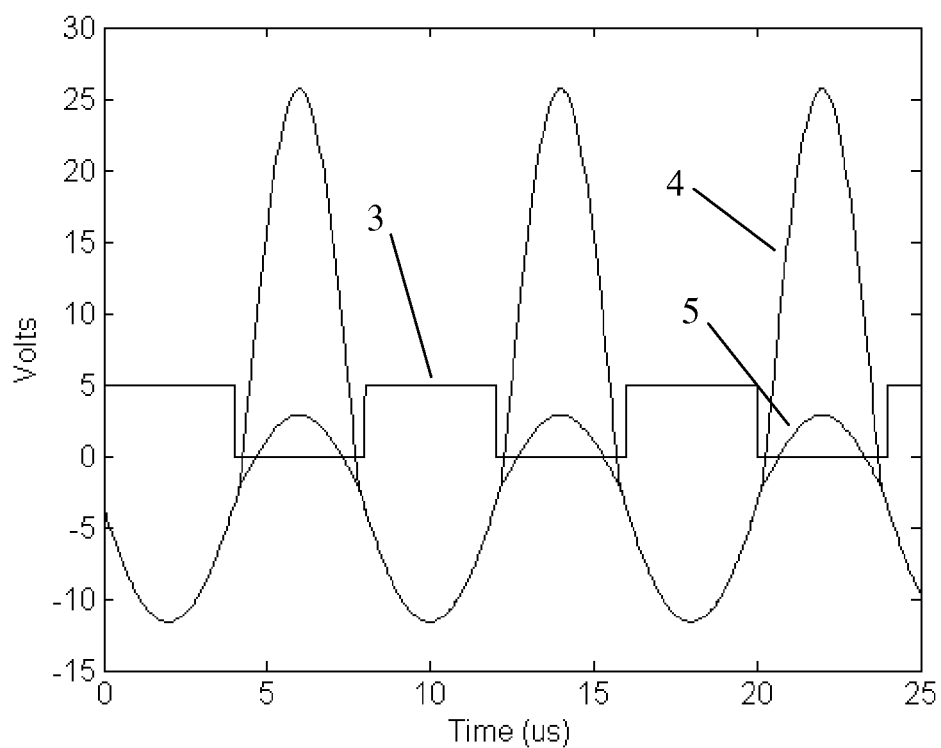
FIG. 2A is a plot of the voltage waveforms of the first embodiment of the resonant circuit with zero volts on the FET gate.

FIG. 2 shows the stimulus voltage, 3, which has been set to a 125 kHz square wave of amplitude 5V. Also shown are the voltages of the FET drain, 4, (also the bottom of the inductor) and the FET source, 5. The FET gate voltage (Vgate) is set to 0V. There are two clear states of the circuit as follows:
1) The FET is turned on when the source voltage is below the gate voltage (0V) by at least the 2V threshold voltage (Vth) of the FET. In this state the source-drain capacitor C2 is shorted out and the source and drain voltages are very close to each other.
2) The FET is turned off when the source voltage is greater than −Vth, in which case the source and drain voltages diverge and the source-drain capacitor charges up.

Each of these two states results in a different effective capacitance in series with the inductor. The first state gives a higher capacitance with 2.2 nF (C1) in parallel with 10 nF (C3), giving a total of 12.2 nF. The second state gives a lower capacitance due to the extra 2.2 nF (C2) in series with 10 nF when the FET is off. This gives a total capacitance of 4.0 nF.

With the gate voltage fixed (at 0V), the oscillation of the source voltage causes a transition between these two states of FET on and FET off. The duty cycle (fraction of the cycle that the FET is on) is controlled by the amplitude of the oscillation. A high level of oscillation gives a near 50% duty cycle, whereas an amplitude less than Vth gives a 0% duty cycle. These two extremes of duty cycle correspond to two extremes of frequency, given by the following equations:

$$f_{50\%} = \frac{1}{\pi\left(\sqrt{L \cdot (C1 + (C2^{-1} + C3^{-1})^{-1})} + \sqrt{L \cdot (C1 + C3)}\right)}$$

$$f_{0\%} = \frac{1}{2\pi\sqrt{L \cdot (C1 + (C2^{-1} + C3^{-1})^{-1})}}$$

For the capacitance values of this example these two frequencies are $f_{50\%}$=106 kHz, $f_{0\%}$=145 kHz. Therefore, depending on the amplitude of oscillation, this circuit is able to respond at any frequency within this range. The frequency chosen in this example leads to an amplitude of oscillation that peaks at approximately +26V, which together with the 2V Vth of the FET gives the appropriate duty cycle for 125 kHz. The asymmetry of the waveforms is a natural consequence of the change in effective capacitance in series with the inductor.

Figure 2B:
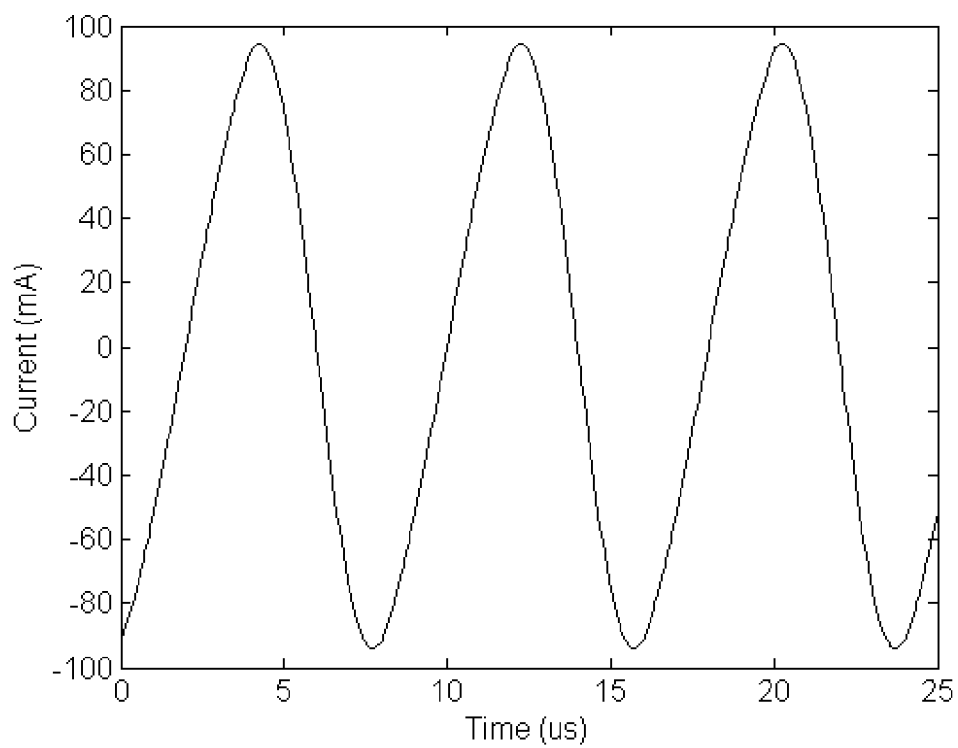
FIG. 2B is the corresponding plot of the antenna current.

FIG. 2B shows the inductor current, which has a more symmetric shape than the voltage. The phase difference between the current and the stimulus voltage is approximately 90 degrees and the net power taken from the stimulus voltage by the resonance is low. In fact it is the slight different from 90 degrees that leads to some net input of energy that maintains the required amplitude for matching to 125 kHz. When the amplitude is not matched to the stimulus frequency (e.g. after a turn on transient, or the stimulus frequency changes, etc) then the relative phase between the stimulus and the current adjusts, resulting in a different power being drained from the stimulus to maintain a new fixed amplitude of resonance. This fixed amplitude of resonance sets the duty cycle to match the new stimulus frequency. As such the circuit naturally adjusts to changes in frequency. At this point it is worth noting that a change in any of the components through temperature or metallic detuning of the inductor would cause a similar response of the circuit, re-tuning to give the correct duty cycle for the stimulus frequency.

Figure 3A:
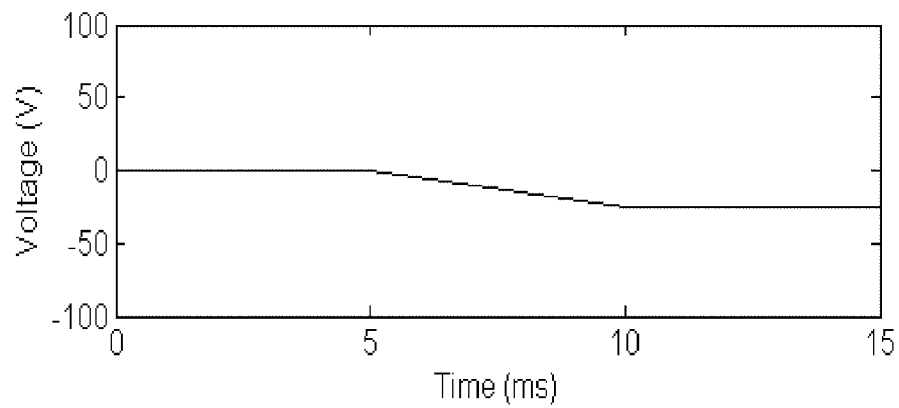
FIG. 3A is a plot of the FET gate voltage reducing to negative potential when the circuit is resonating.
Figure 3B:
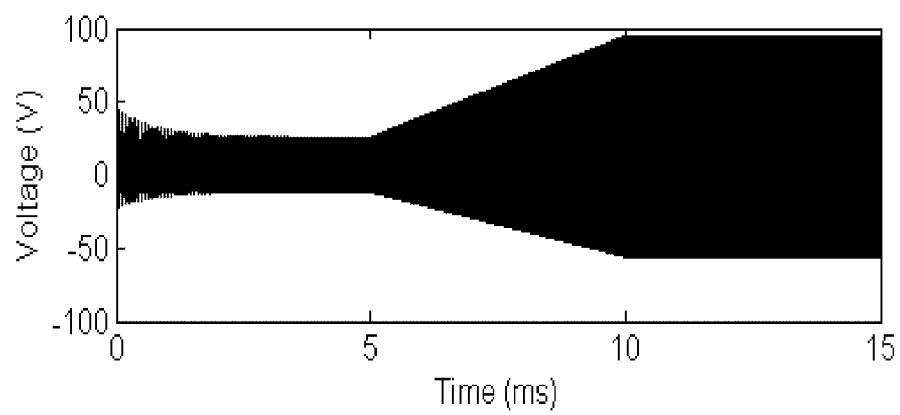
FIGS. 3B and 3C are the corresponding voltage and antenna current waveforms, respectively.
Figure 3C:
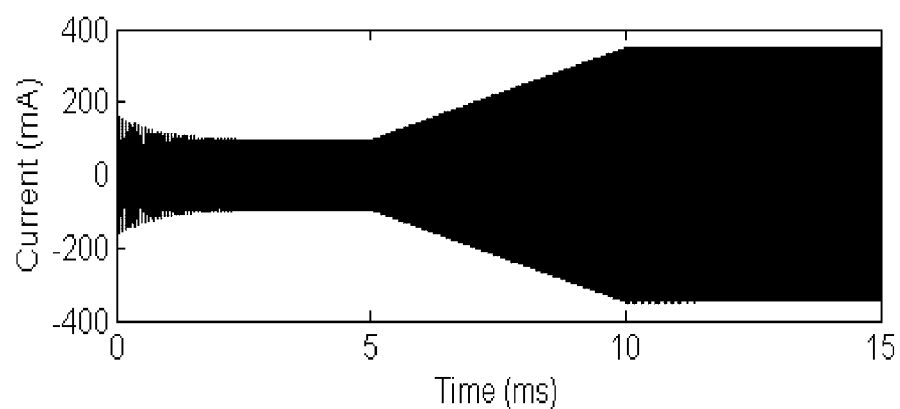

The amplitude of the resonance may be further controlled through the gate voltage Vg, FIG. 3A shows the profile of Vg, which is initially set to 0V for 5 ms to allow turn-on transients to settle. Subsequently it is reduced from 0V to 25V over a 5 ms window, and a further 5 ms at −25V. The effect on the drain voltage and the inductor current is shown in FIGS. 3B and 3C, respectively. The lower value of gate voltage means that a larger amplitude is required in order to turn the FET off, since the source needs to be at least Vth below the gate voltage. In order to set the same duty cycle to match 125 kHz the amplitude of the resonance increases. In this manner, the resonance amplitude may be controlled through the constant gate voltage on the FET.

Another consequence of the increased amplitude is a changed relative phase between the resonance and the stimulus waveform. The current and stimulus waveforms are more in-phase, drawing greater power to maintain the higher resonance amplitude. The process of increasing the amplitude through the voltage on the FET gate may continue until the stimulus and resonance are in phase.

Figure 4:
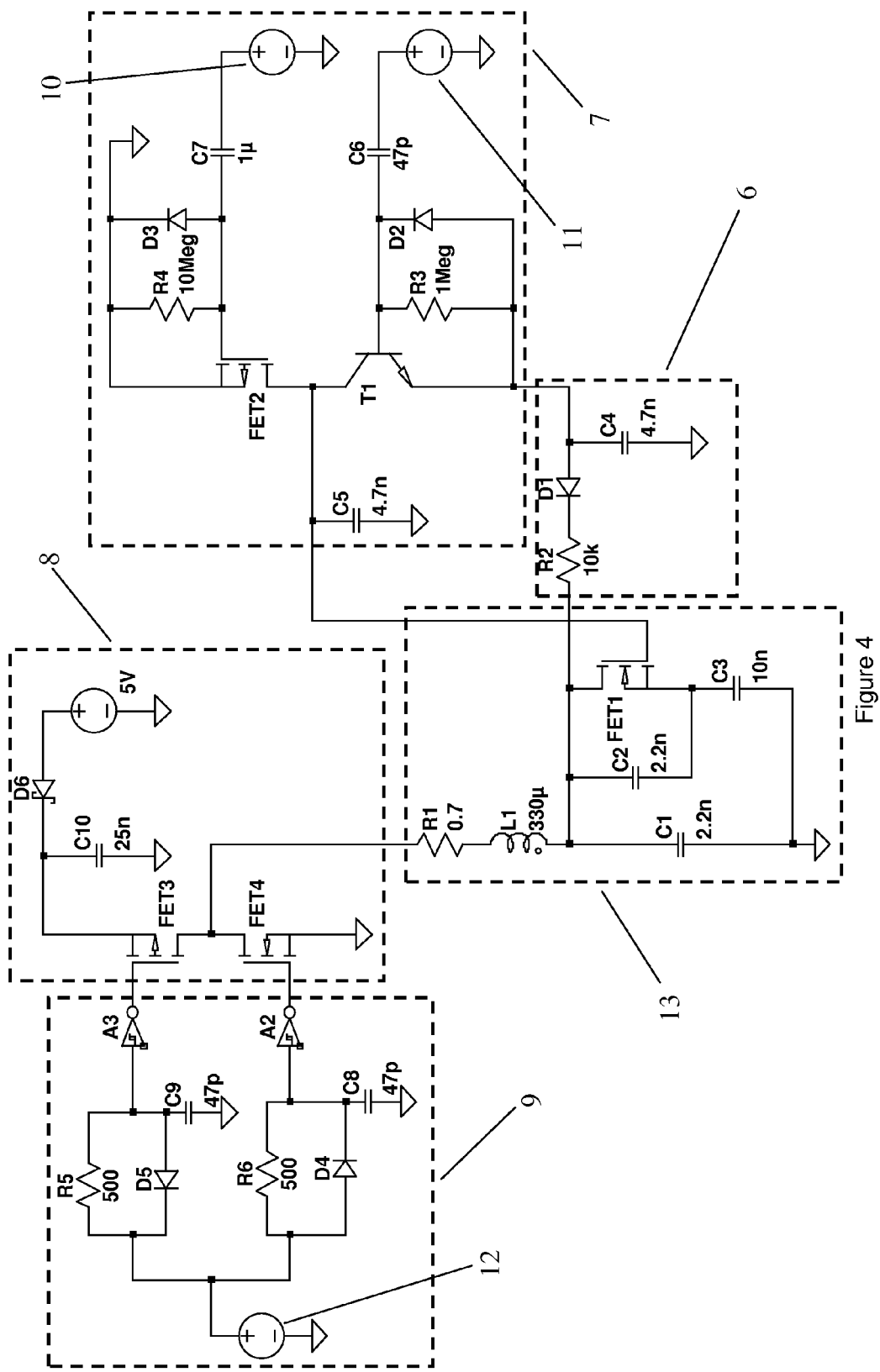
FIG. 4 is a schematic of an embodiment of a tag reader comprising a resonant circuit as shown in FIG. 1 with added sections to control the FET gate voltage and supply the stimulus signals.

FIG. 4 shows a circuit with the same resonant circuit as FIG. 1 but with the control portions of FIG. 1 shown explicitly as added control circuitry. The functions of the main blocks are indicated on the figure and are now described:

Resonant Circuit, 13

This is as described for FIG. 1.

Negative Voltage Rail, 6

This block takes as its input the resonance voltage from the FET1 drain and stores the peak negative voltage on C4 (less one diode drop). This stored negative voltage is subsequently used by the gate voltage control block to set the FET1 gate voltage.

Gate Voltage Control, 7

This block has two digital control lines, Vg_ZERO, 10, and Vg_DEC, 11. A voltage pulse on Vg_ZERO turns FET2 on and the storage capacitor C5 is connected to ground. A voltage pulse on Vg_DEC gives rise to conduction through T1 to the negative voltage rail; the voltage on C5 is made more negative. Using the digital control lines the voltage on C5 may be gradually made more negative or may be zeroed. This is connected to FET1 gate and so controls the amplitude of the oscillation of the resonance circuit. The amplitude of the resonance may either be set with a fixed number of pulses on Vg_DEC or alternatively the gate voltage may be reduced until the amplitude, e.g. measured with an ADC, reaches the desired value.

Stimulus Pulse Generator, 8

An n&p type MOSFET pair are used to control the stimulus voltage applied to the resonance circuit. The positive voltage (V1) is coupled in via a shottkey diode with the result that the transient current into the resonance is taken via C10 to ground. D6 and V1 supply just the end voltage of the stimulus pulse and enough current to keep the resonance at a constant amplitude. This design of stimulus pulse generator is particularly useful if the power supplied to the resonance is required to be monitored. This may be straightforwardly monitored through a measurement of the current pulses through D6. Alternatively if there is no such requirement then C10 and D6 may be removed, provided the 5V supply has sufficient capacitance and low series resistance to efficiently recycle the transient current generated by the resonance.

Deadband Delay Generator, 9

Lastly, the deadband delay generator takes the digital waveform Vstimulus, 12, as its input and generates a deadband delay that avoids shoot-through current in the stimulus FETs.

In summary the circuit shown in FIG. 4 enables an inductor current to be set over a range of frequencies determined by the inductor L1 and the capacitors C1, C2, C3, where the amplitude is set by the FET gate voltage. Furthermore the circuit will naturally adjust to different frequencies within this range and also changes in component values (provided the stimulus frequency remains within the range capability of the circuit). As such this approach is tolerant to detuning through temperature, metallic environments, and also manufacturing tolerances on component values.

The description above has been in terms of a square wave stimulus waveform. However, this also may be a reduced duty cycle waveform, provided it can supply sufficient energy to maintain the resonance. An alternative approach is to stimulate the circuit with a waveform at a sub-harmonic of the target frequency. The main advantage of this scheme is that the n&p stimulus FETs are switched less often, leading to reduced losses in the charging/discharging of these components. A more efficient circuit operation may therefore be achieved.

The three capacitor network shown in the embodiments is not the exclusive implementation this invention. In fact the circuit may be simplified by removing C2 altogether. In this case the FET source voltage stays constant when the FET is turned off. However it has generally been found advantageous to include some capacitance for C2, which serves to increase the FET source potential when the PET is off. This acts to turn the FET off further, which minimises leakage through the FET, particularly as the gate potential can vary due to the finite gate voltage storage capacitor C5.

The task of tuning the reader antenna to a transponder resonance may be carried out with one of the following methods:

1) The reader may step or sweep the stimulus frequency and monitor the power drain from the transponder. This may be carried out by monitoring the power drain from the 5V source.
2) The reader may step or sweep the stimulus amplitude and frequency with the aim to determine the threshold amplitude as a function of frequency where the transponder modulation may be picked up. The lowest threshold amplitude will generally be at the transponder resonance frequency.
3) When the transponder modulates with a normal resistive load modulation then the transformed transponder impedance seen by the reader is also a resistive modulation when operating at the transponder resonance. When the operating frequency is different to the transponder resonance a reactive component is present in the transformed impedance. The reader may monitor the transformed impedance and adjust the frequency until a resistive impedance results.
4) The circuit may be periodically stimulated with a pulse, generating a decaying resonant waveform. The amplitude of oscillation is linked to the natural frequency of the oscillation through the duty cycle of the capacitive paths. The result is that the free decay also sweeps over a frequency range i.e. it generates a decaying chirp. Such a signal may be used to sweep over the potential transponder frequencies. Waveform differences with respect to a reference trace may be used to indicate the frequency of maximum absorption from the reader. This frequency would correspond to the transponder resonant frequency and the reader may be tuned accordingly. Such a system may be used as a low power method to detect the presence of a transponder and also its resonant frequency. Once detected the reader may read the transponder in the normal way. This method is implemented in the 4$^{th}$ embodiment of the invention.

Second Embodiment

Figure 5:
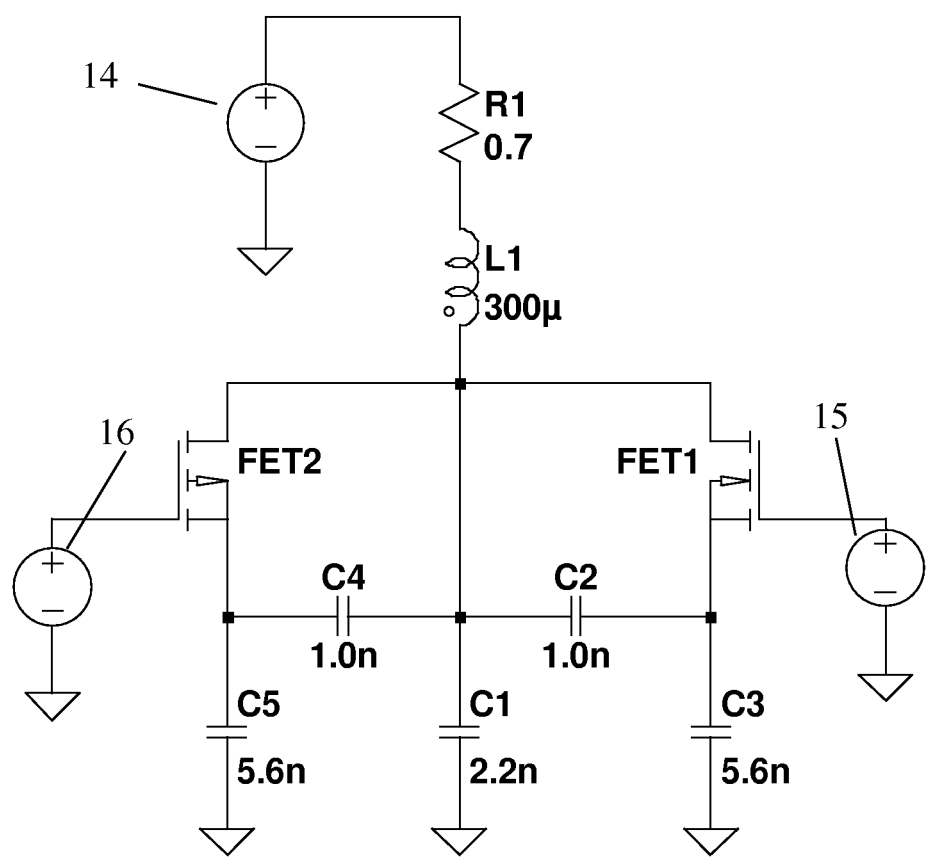
FIG. 5 is a schematic of a second embodiment of a resonant circuit.

FIG. 5 shows an alternative embodiment of the invention. In addition to the n-type PET shown in FIG. 1, this embodiment also includes a p-type FET. The state of the n-type FET changes on the negative cycle of the FET drain, and the p-type FET changes on the positive cycle. For low amplitudes both FETs are non-conducting, whereas for high amplitudes both are conducting. The design equations for the frequency limits at 0% duty cycle and 100% duty cycle (duty cycle is the fraction of the cycle that at least one of the FETs is conducting) are as follows:

$$f_{100\%} = \frac{1}{\pi\left(\sqrt{L \cdot (C1 - C3)} + \sqrt{L \cdot (C1 + C5)}\right)}$$

$$f_{0\%} = \frac{1}{\pi\left(\sqrt{L \cdot (C1 + (C2^{-1} + C3^{-1})^{-1})} + \sqrt{L \cdot (C1 + (C4^{-1} + C5^{-1})^{-1})}\right)}$$

The values shown in FIG. 5 give a frequency range of $f_{100\%}$=104 kHz and $f_{0\%}$=147 kHz. When setting the amplitude of the resonance with the gate voltages Vgate1, 15, and Vgate2, 16, this is done in a similar manner to the single FET version of the first embodiment except that these voltages should go in opposite directions. Vgate1 is reduced to negative voltages and Vgate2 is increased to positive voltages by the same amount.

One feature of this embodiment is that the effect of the FETs and capacitor networks on the waveform is more symmetric than the single FET version. This can lead to an inductor current that has reduced distortion. If this is a requirement to meet emission regulations then it may justify the extra complexity of the circuit. In addition, the voltage swing of the FET drain, for a given inductor current, is reduced relative to the first embodiment. This property may allow the use of FETs with a lower specification of the maximum source-drain voltage. As such the cost of the FETs may be reduced and/or their properties improved through reduced turn-on resistance, etc.

Third Embodiment

Figure 6:
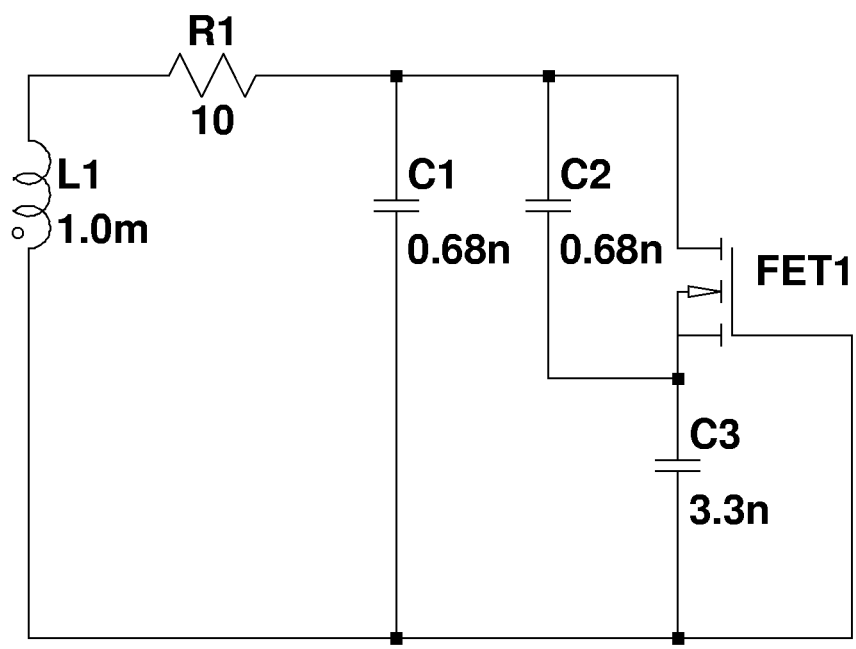
FIG. 6 is a schematic of an embodiment of a transponder comprising a resonant circuit.

FIG. 6 shows an embodiment of a circuit which can be used to extract power from an rf field, for example for an RFID transponder, or other remotely powered device. This circuit is driven by an rf field in which it is located. Power can be taken from the circuit at any convenient point, for example across C1 and rectified. To provide a return signal from the transponder power from the circuit may, for example, be used to power an rf oscillator which can be modulated with the return signal. The transponder inductance is increased relative to the earlier 300 µH transmitting antenna example (FIG. 1). This is to increase the induced voltage in the transponder in response to an oscillating field. The capacitors C1, C2, C3 are reduced by the same factor resulting in the same frequency range as the first embodiment ($f_{50\%}$=106 kHz, $f_{0\%}$=145 kHz). The Q of the transponder is set by the coil effective series resistance (R1), which has been set to 10Ω in this example, giving a high Q of approximately 80 at 125 kHz. The n-type MOSFET has a low threshold voltage of 0.5V.

Figure 7A:
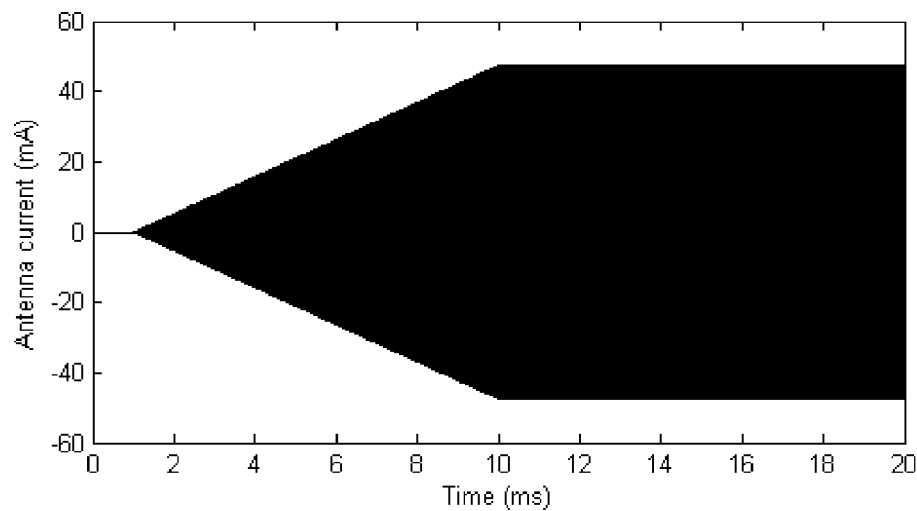
FIGS. 7A and 7B are plots of the antenna current and voltage respectively for the transponder of FIG. 6, excited by an external field.

The transponder circuit is coupled weakly to a transmitting antenna of inductance 300 mH. The coupling constant between the two inductors is 1%. FIG. 7A shows the current in the transmitting antenna, which is zero for the first 1 ms, then increasing linearly to 50 mA by 10 ms, then remaining constant amplitude. This waveform has been chosen to illustrate the operation of the circuit.

Figure 7B:
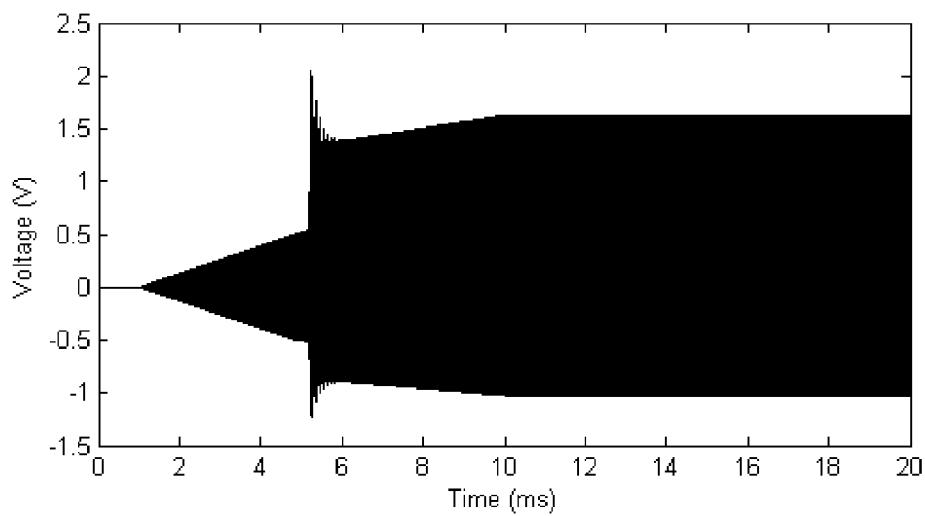

FIG. 7B shows the corresponding FET drain voltage in the transponder circuit. As the current in the transmitting antenna increases, then so does the current in the transponder circuit antenna and the FET drain voltage increases accordingly. Once the FET drain voltage reaches 0.5V, the threshold voltage of the FET, then the FET begins to conduct over part of each cycle. This allows the resonance to build up in the circuit, matching the duty cycle to the stimulus frequency of 125 kHz. There is a marked jump in the FET drain voltage when this matching occurs. At this point the circuit is self-adjusted to the stimulus frequency.

Figure 8:
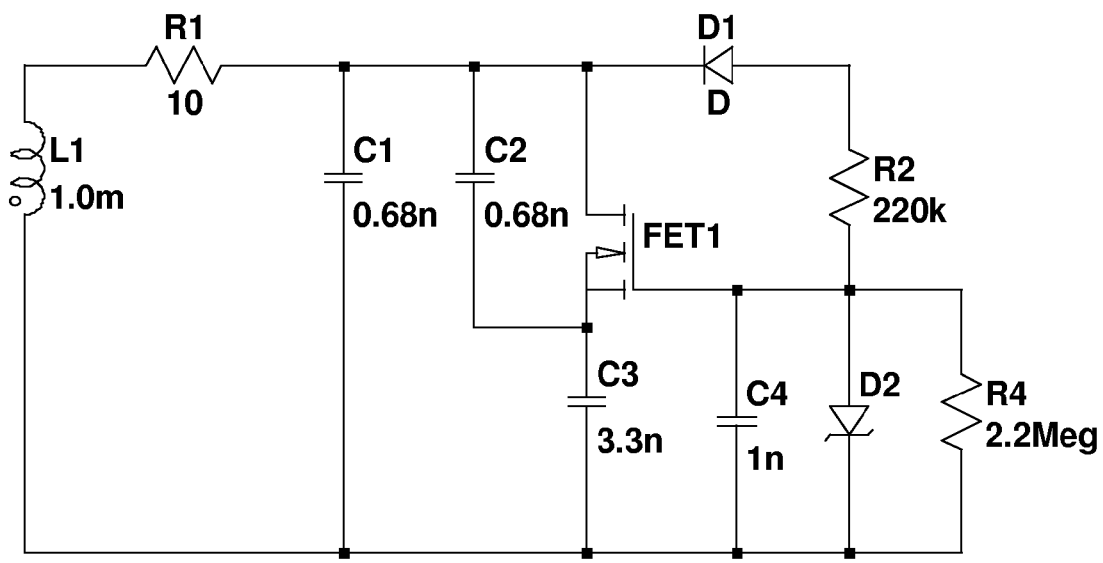
FIG. 8 is a schematic of an embodiment of a transponder comprising a resonant circuit as shown in FIG. 6 with added circuit elements to build up the amplitude of the resonance through the FET gate voltage.

FIG. 8 shows a further development of the transponder circuit. Here an additional branch has been added that couples the FET drain to the gate via diode D1. Once the circuit adjusts to the stimulus frequency and the amplitude of the voltage on the FET drain jumps above 0.5V, the diode D1 starts to conduct over part of the cycle, pulling the gate voltage low. As the gate voltage drops to negative voltage, the amplitude of the resonance increases. This process continues until the FET gate voltage reaches the limit set by reverse current flowing in the 5V zener diode (D2). The resistor R4 is included to tie the gate voltage to zero in the absence of a resonance in the transponder circuit. As such the transponder circuit is ready for exposure to the reading field. Broadly the arrangement of FIG. 8 automatically controls (lowers) the gate voltage of the FET to increase the amplitude of the resonance to extract increased power from the rf field.

Figure 9A:
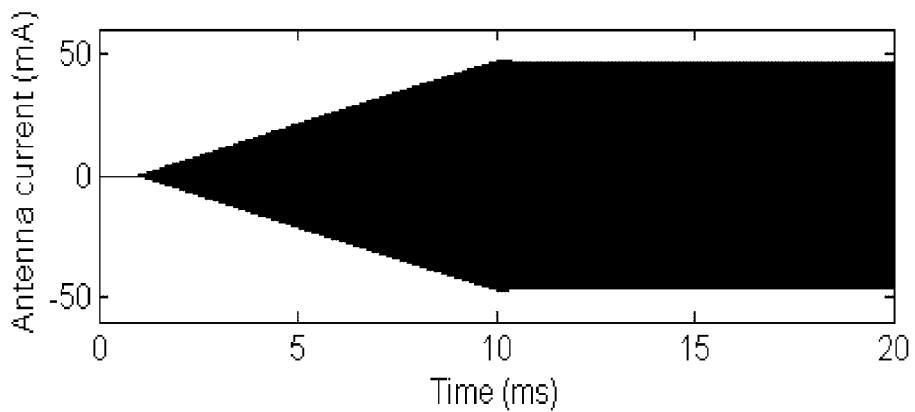
FIG. 9A is a plot of the antenna current for the transponder of FIG. 8, excited by an external field.
Figure 9B:
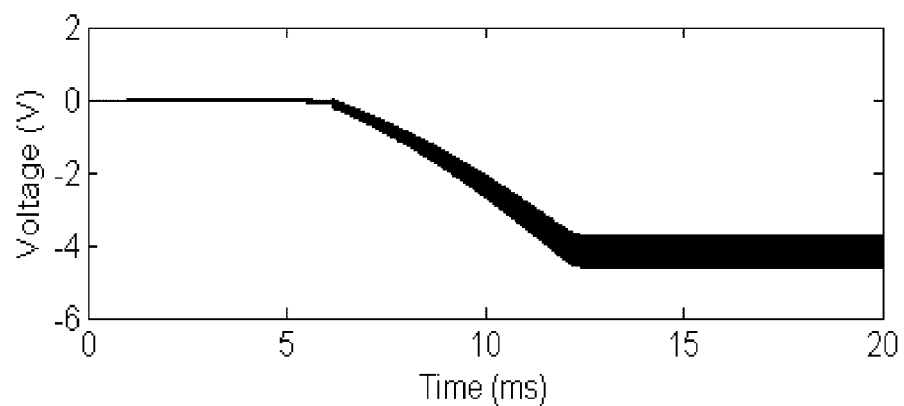
FIGS. 9B and 9C are the corresponding plots of the FET gate voltage and antenna voltage, respectively.
Figure 9C:
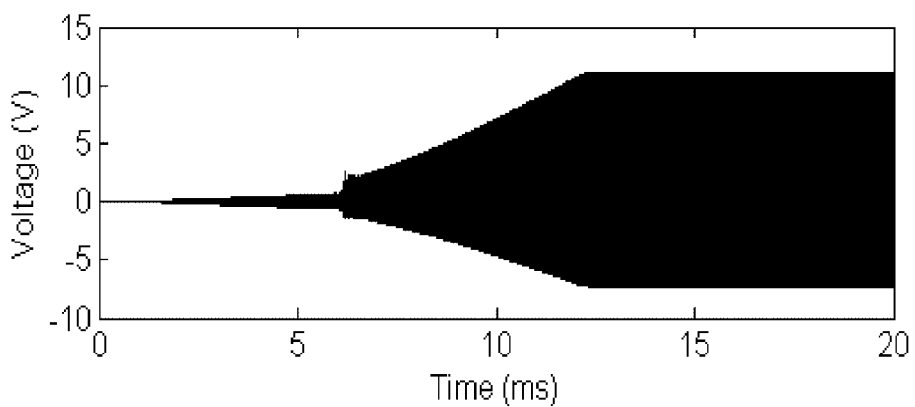

The operation of the circuit described above is illustrated by the waveforms in FIG. 9. FIG. 9A shows the same transmitter antenna current as FIG. 7. FIG. 9B shows the transponder FET gate voltage, decreasing to negative voltage when the circuit has adjusted to the stimulus frequency (Vdrain exceeds the 0.5V threshold voltage of the FET). FIG. 9C shows the build up in the transponder circuit resonance as the gate voltage drops.

In order for the transponder circuit to adjust to the frequency of the stimulus field and ramp the amplitude of the pickup voltage, it is required that the pickup voltage first exceeds the threshold voltage of the FET. In the above embodiment a low threshold FET has been used such that this may take place at low coupling levels. An alternative approach is to increase the inductance of the transponder circuit, which in turn generates a higher voltage in the transponder although with a higher source impedance. In this manner the specific requirement for low threshold may be reduced. However with a high transponder circuit inductance, the resonance may be required to build up to a higher final voltage in order to transfer the same level of power from the energising field. This increased voltage may be required both for powering of the transponder and also for any modulation that the transponder circuit carries out to communicate with the reader.

A further benefit of the above embodiment occurs when the transponder circuit coupling to the reader is increased. At high coupling levels one approach is to introduce a regulator to limit the pickup voltage and avoid damage to the rest of the circuitry. One drawback of this approach is that the transponder may absorb a significant proportion of the energising field, which is subsequently dissipated as heat in the regulator. This embodiment however limits the pickup voltage through the relative phase between the transponder resonance and the energising field i.e. the actual level of pickup is reduced, not just withstood through the use of a regulator. Through this improved behaviour in the high coupling case, this embodiment can avoid issues such as the transponder shading the energising field. This may be beneficial when reading multiple transponders.

In summary, this embodiment illustrates how the variable duty cycle technique may be applied to a remotely powered device such as an RFID transponder. The circuit may self-adjust to the stimulus field, provided the stimulus frequency is with in the range of the transponder circuit and also that the amplitude exceeds the threshold voltage of the FET used together with the capacitor network. It has also been shown that the gate voltage may be automatically ramped such that an increased amplitude of resonance builds in the transponder.

The transponder circuit described above has several advantages, including as follows:

1. A high Q transponder may be used without the usual complications of precise matching of the stimulus field to the transponder frequency; the transponder adjusts to the stimulus frequency.
2. The system is more tolerant to variations in temperature and metallic environment that can affect the transponder frequency. Provided the stimulus is within the frequency range of the transponder circuit, a degree of variation in the component values will not affect the operation.
3. The system is more tolerant to variations in component values at manufacture. As such careful tuning of the component values may not be required, leading to a potentially lower cost of manufacture. This can also facilitate manufacturing techniques that may not currently be able to achieve the tolerances required for prior art implementations. Examples of such techniques may include printed electronics and organic semiconductors.
4. The transponder can respond to more than one reader frequency. As such, transport across international borders where the regulatory frequency band changes may be tolerated.
5. The action of the circuit with a fixed gate is similar to a regulator. The gate voltage sets the amplitude at which the duty cycle matches the stimulus frequency. The main change that an increase in coupling constant has is to change the relative phase of the stimulus and transponder response. The amplitude of the transponder resonance stays approximately the same. As such, an additional regulator may not be necessary in the transponder. This also reduces the effect of a closely coupled transponder shading the reader field from additional transponders.

Fourth Embodiment

In a fourth embodiment, the circuit shown in FIG. 1 is used in free decay, rather than steady state excitation. When used in free decay, the duty cycle of FET conduction is determined by the decay waveform, and changes as a function of time. The resultant behaviour is a chirp signal, rising in frequency as the energy in the circuit decays. This embodiment may be used in a reader to detect the presence of a transponder and/or its resonant frequency.

Figure 10A:
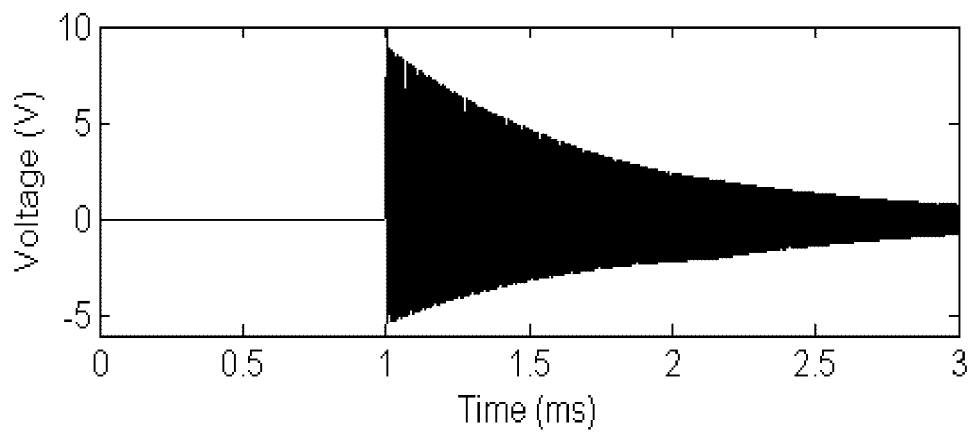
FIGS. 10A and 10B are decay waveforms of a fourth embodiment of a resonant circuit, where the circuit of FIG. 1 is excited with a 4 µs pulse.
Figure 10B:
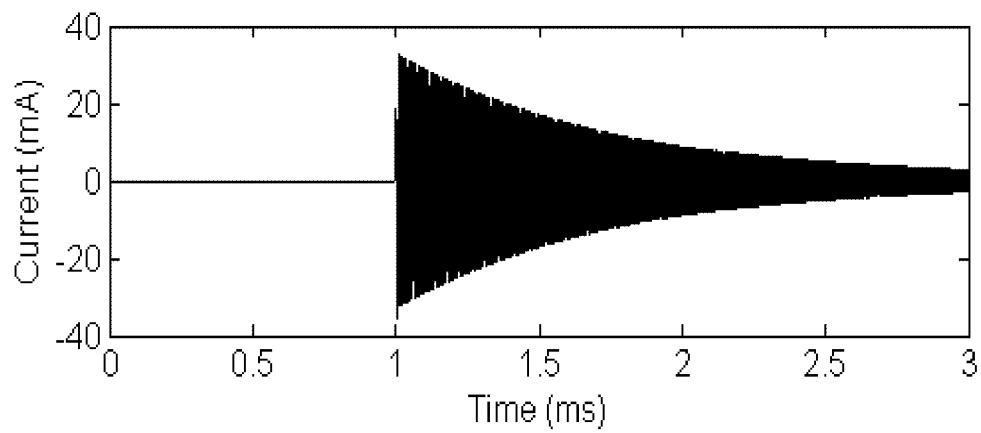

A 4 µs square voltage pulse of amplitude 5V is applied to Vstimulus, 2, and the FET gate voltage, 1, is kept at 0V. FIG. 10A shows the decay of the FET drain voltage and FIG. 10B shows the antenna current. The drain voltage is asymmetric when the FET duty cycle is non-zero, which is a natural consequence of the two different capacitances coupled into the resonance. The antenna current on the other hand is more symmetric.

Figure 10C:
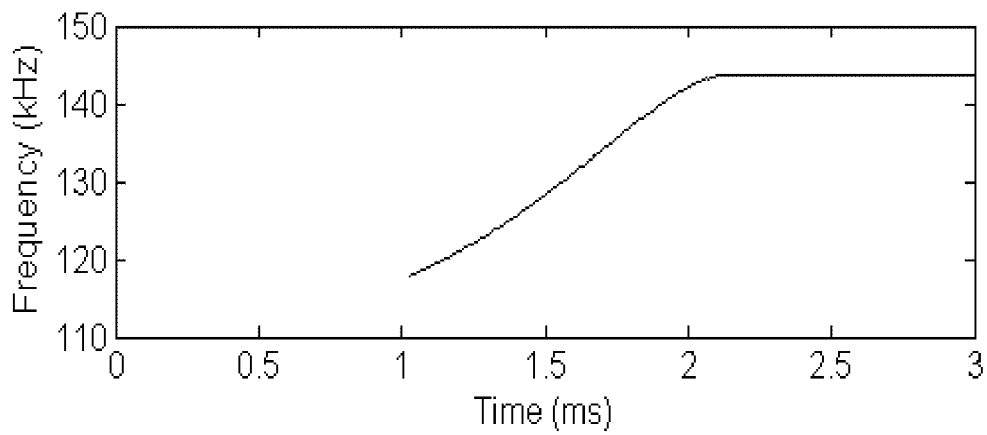
FIG. 10C is the instantaneous frequency of the free decay.

FIG. 10C shows the instantaneous frequency of the chirp as a function of time. The chirp starts off at 117.9 kHz, rising to a maximum of 144 kHz. The high frequency limit compares well to a predicted $f_{0\%}$ of 145 kHz, however the start frequency is above the other limit of $f_{50\%}$=106 kHz. This is because 50% duty cycle is only approached where the amplitude is much greater than the threshold voltage Vth. If a lower starting frequency is required for the same capacitive network then one or more of the following methods may be employed:

1) Increase the initial amplitude of the oscillation, for example by a double pulse stimulus.
2) Change the FET for one with a lower Vth.
3) Put a positive gate voltage on the FET of amplitude less than Vth. This keeps the operation of the circuit the same i.e. the FET conducts only on the negative cycle of the FET source voltage. However, the amplitude required for FET turn on with such a positive gate voltage is reduced.

Figure 11A:
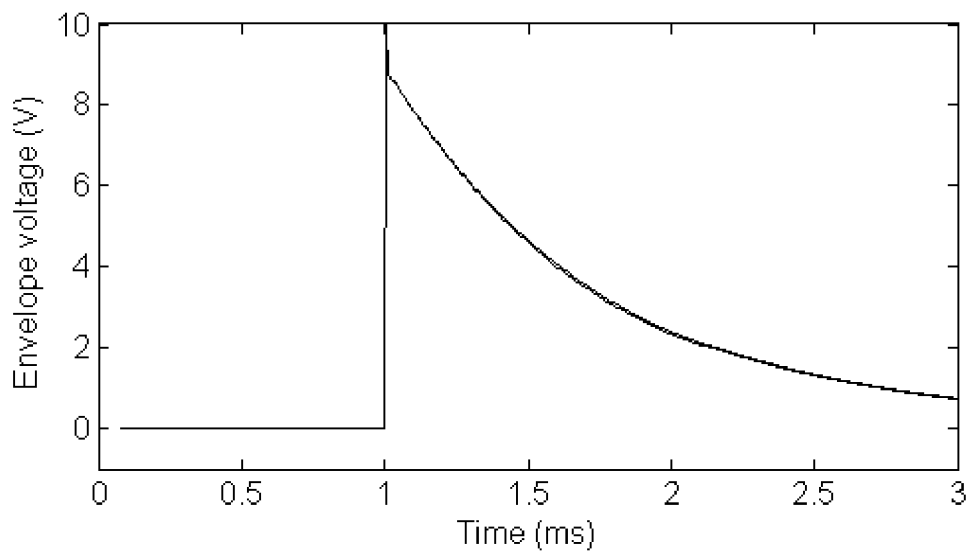
FIG. 11A is a graph showing an envelope function of the voltage decay in FIG. 10A, overlaid with a similar trace where a 125 kHz transponder is present in the proximity of the reader.

FIG. 11A shows the decay envelope of the FET drain voltage. Also overlaid with this trace is a virtually indistinguishable trace of the decay envelope when a resonant transponder has been introduced. The transponder comprises a 1 mH inductor in parallel with a 1.6 nF capacitor, giving a resonant frequency of 125 kHz. The effective series resistance of the inductor is 50Ω, which gives the transponder a Q of approximately 15. The coupling between the reader antenna and the transponder is set low at 0.3%.

Figure 11B:
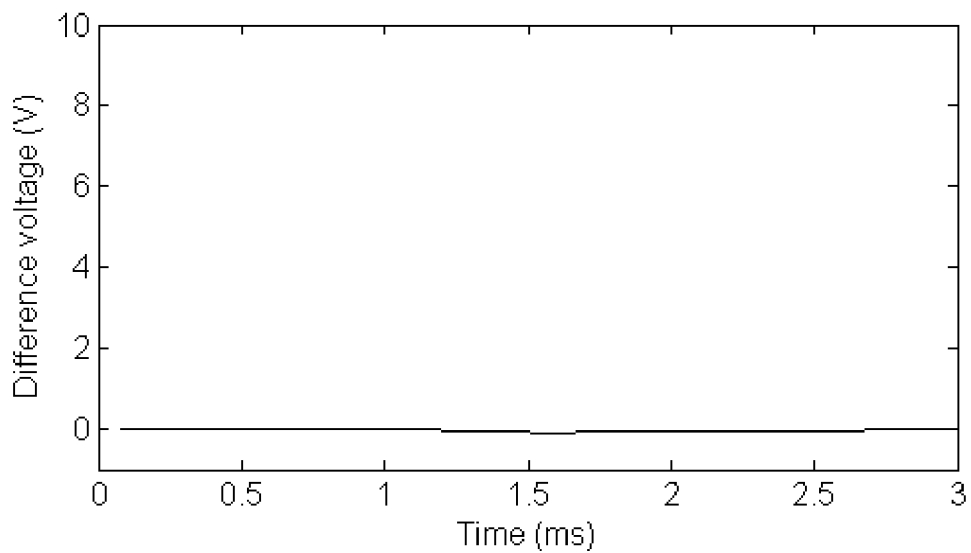
FIG. 11B is the difference between these two envelope functions plotted on the same vertical scale.

FIG. 11B shows the difference in the decay envelopes on the same vertical scale. The result is very low, illustrating their very close match. In fact the maximum difference is approximately 2%, a very low level that would be hard to pickup with a measurement of energy decay.

Figure 12A:
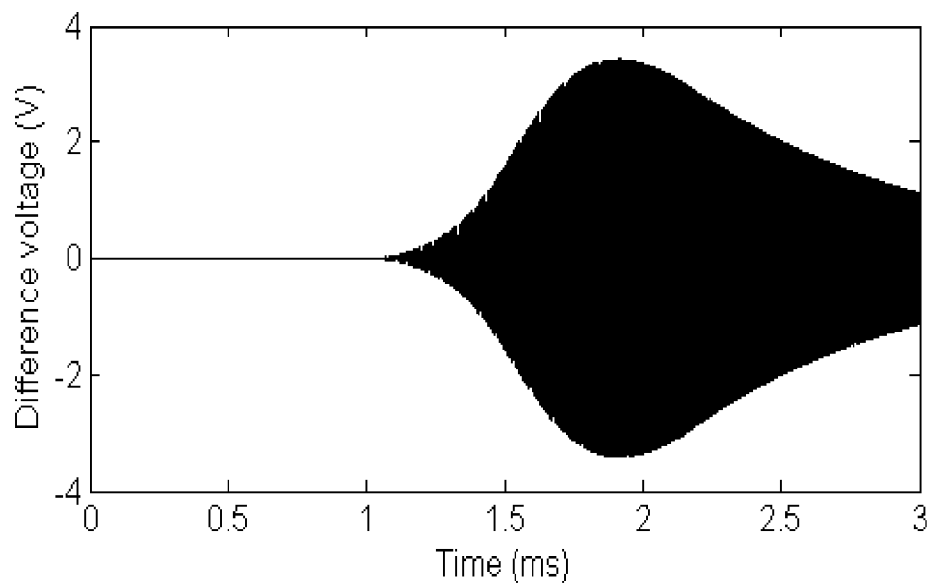
FIG. 12A is the difference between the two decay waveforms with and without the transponder present.

Rather than looking at the decay envelope, FIG. 12A shows the difference in the actual waveforms between the transponder present and transponder absent. This measurement has the great advantage that it is sensitive to differences in phase and the result has much improved sensitivity to the presence of the transponder. As the chirp decays and sweeps through its frequency range, the transponder absorbs a small proportion of energy, changing the frequency of the decay. A phase difference relative to the reference waveform builds up over time and this gives the large difference voltage in FIG. 5A. The voltage difference is maximal at approximately 1.9 ms (0.9 ms from the start of the chirp), reducing after this time as the chirp decays further. Note that once the amplitude of the chirp decays below Vth and the duty cycle of the FET is zero, the phase difference between the traces stays constant and the difference waveform decays with amplitude of the chirp; in this example the zero duty cycle threshold is approximately 2.15 ms.

Figure 12B:
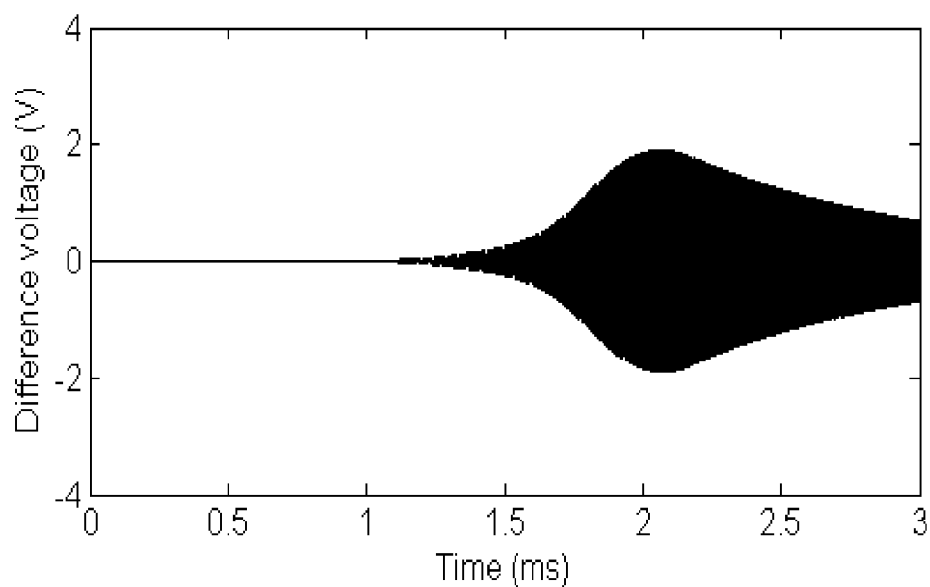
FIG. 12B is a similar difference waveform where the transponder resonance frequency has been increased from 125 kHz to 134 kHz.

FIG. 12B shows a similar waveform difference measurement where the transponder frequency has been increased from 125 kHz to 134 kHz (transponder resonance capacitance decreased from 1.6 nF to 1.4 nF). A change to the difference voltage is clear, in particular the onset of a sharp rise in the difference voltage is delayed with respect to the 125 kHz transponder. This is as expected since the chirp frequency is rising with time and therefore matches the new transponder frequency later in the decay. The amplitude of the effect is also lower, which is a result of less chirp duration after the transponder has started to have an appreciable effect on the decay. The chirp moves into the zero duty cycle region relatively soon after the transponder is excited and the phase difference relative to the reference stops increasing. The comparison of FIGS. 12A and 12B shows how the shape of the difference waveform may be used to discriminate between transponders with resonant frequencies 125 kHz and 134 kHz. Further analysis, particularly of the start point of the difference waveform may allow the transponder frequency to be determined with finer resolution.

Figure 13:
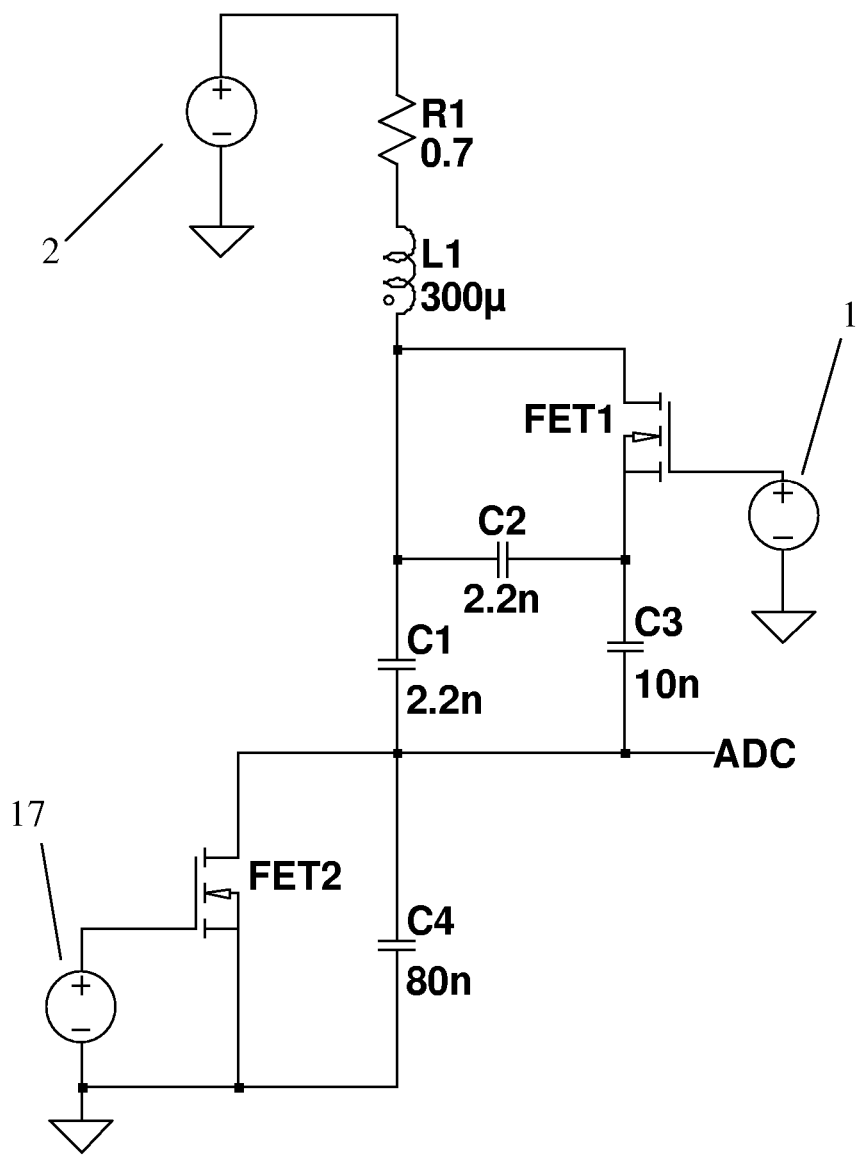
FIG. 13 is a schematic a resonant circuit with added components to sample the amplitude of a chirp decay for proximity detection.

FIG. 13 shows an addition to the fourth embodiment based with an additional capacitor (C4) and FET (FET2) controlled by voltage source 17. When the FET is turned off the antenna current flows through C4, which consequently generates a voltage. In this example C4 is much larger than the other resonance capacitors and therefore does not strongly affect the frequency range of the chirp. Furthermore, because of the large capacitance, the voltage generated has an amplitude less than 0.7V and does not therefore conduct through the body diode of FET2. The voltage at the junction of C1 and C4 may be subsequently taken to an analogue to digital converter (ADC) for sampling. The ADC will generally have a sample and hold function included such that it digitises the value of the waveform on a timescale significantly less than the time period of that waveform.

The main advantage of this circuit is that the ADC input may be bypassed by turning FET2 on, in which case the antenna current is returned to ground rather than flowing through C4. In this manner the ADC input, which is set-up for the low power proximity detection of the transponder, is protected when the reader switches into a full power identification mode. The large voltages generated in the full power mode, such as at the drain of FET 1, are not loaded by the proximity detection circuit elements and therefore do not cause any damage.

An alternative manner in which the circuit in FIG. 13 may be used is to keep FET2 on for most of the chirp decay, only turning it off when the decay waveform is sampled. If, by the time it is sampled, the chirp is decayed significantly from its start level then a smaller value for the capacitance C4 may be used, still keeping the amplitude below 0.7V (and therefore avoiding the body diode path through FET2). In this manner the voltage sampled by the ADC may be increased (up to 0.7V), improving the signal to noise of the measurement.

One further alternative is keep FET2 off for the duration of the chirp decay and introduce some gain before the ADC samples the voltage. This may also include a voltage offset such that the dynamic range of the signals is appropriate for the input range of the ADC. An increase in signal to noise by this method is at the expense of power drain from the additional gain circuitry. In order to minimise this additional power drain, the amplification stage may be powered at a reduced duty cycle corresponding to the repeat rate of the chirp.

The following techniques may be applied to engineer a robust system from the fundamental concept of the chirp decay:

1) Monitoring the reference signals over time allows the system to system to track longer term changes not associated with the proximity of a transponder. Examples of such changes that are beneficially ignored include temperature changes, changes to the absorption from surrounding metal, and a gradual droop in the battery voltage that will cause variations in the chirp decay.
2) Averaging signals over many samples may give improvements in the signal to noise and therefore the robustness of the system. Such averaging may be carried out at the same sample time relative to the chirp start, and averaged over several separate chirps.
3) Multiple points within one chirp may be sampled and the difference to a reference determined at each sample. The decision as to whether a system change has taken place may be made more accurately by combining these separate measurements. Such a sampling of multiple points may be combined with a determination of the transponder resonant frequency.

The circuits described in the above embodiments provide resonance behaviour, while also responding to a range of frequencies. In particular, the step up of voltage is achieved through re-cycling transient energy transferred between the inductor and capacitor network.

One feature common to these circuits is that the resonance naturally turns the FET on and off through the variation in the FET source potential. The charge required to turn the FET on and off is therefore supplied though the resonance inductor. As such the FET is turned on and off efficiently, without the normal losses associated with directly switching the FET gate with an external voltage. This benefits low power operation of the circuit and allows a high Q resonance to be set up (low Ron FET) without excessive switching losses. A further advantage is that the turn on/off is smooth and does not give rise to strong switching transients.

Although the embodiments described above are benefited by the resonance switching the FET on/off, it is also possible to set up an externally switched arrangement. This would require additional power to switch the FET and careful timing control to ensure that the duty cycle of the circuit was correct for the stimulus frequency. Thus in embodiments a controllable element, such as a switching element or transistor, is controlled by a control device including a timing control circuit.

The methods outlined above allow operation of a high Q LC resonance with a very stable external clock source, such as a crystal resonator. As such a field may be generated efficiently that is very constant with time, both in amplitude/phase and frequency. Such a task is advantageous when implementing a read function of an RFID transponder, as any noise on the reading waveform may translate to noise in the output waveform.

The 125 kHz frequency band chosen for the embodiments is purely by way of example. Applications of the invention are not limited to frequencies around this band, and extend to include all oscillator frequencies ranging from sub-sonic to microwave frequencies and beyond. More specifically to RFID, all common RFID frequency bands are included, such as 125 kHz, 134 kHz, 13.56 MHz, 869 MHz, 915 MHz, and the like.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A controllable electric resonator comprising an inductor coupled to a first capacitor to form a resonant circuit, the resonator further comprising a controllable element and a second capacitor, said controllable element arranged to control a total effective capacitance of said first and second capacitors, said resonant circuit comprising said total effective capacitance, the resonator further comprising a control device to provide a voltage to control said controllable element, said voltage substantially constant over a cycle of oscillation of a signal on said resonator, wherein the controllable element comprises a transistor having a gate terminal configured to receive said voltage, a source terminal configured to receive a first resonance waveform of said resonant circuit and a drain terminal configured to receive a second resonance waveform of said resonant circuit, the transistor is configured to switch when a difference between said voltage and said received first resonance waveform on said source terminal reaches a threshold voltage of the transistor, the transistor thereby configured to turn on and off during said cycle of oscillation to vary said total effective capacitance of said first and second capacitors over said cycle of oscillation.

2. A controllable electronic resonator as claimed in claim 1 wherein said control device comprises a bias circuit for said transistor.

3. A controllable electronic resonator as claimed in claim 2 wherein said transistor comprises a MOS transistor.

4. A controllable electronic resonator as claimed in claim 2 further comprising a power supply circuit to derive a power supply for said bias circuit from said oscillatory signal.

5. A controllable electronic resonator as claimed in claim 2 wherein said bias circuit is configured to automatically adjust a bias on said transistor to increase an amplitude of said oscillatory signal.

6. A controllable electronic resonator as claimed in claim 1 further comprising a third capacitor connected across said controllable element.

7. A controllable electronic resonator as claimed in any preceding claim wherein said inductor has a Q of greater than 50.

8. A controllable electronic resonator as claimed in claim 1 further comprising a drive system to drive said oscillatory signal on said resonator.

9. A controllable electronic resonator as claimed in claim 8 wherein said drive system includes means for converting a current drawn by said resonator into a pulse having a duration depending on said current.

10. A controllable electronic resonator according to claim 1, the controllable electronic resonator incorporated in an RFID tag, is configured to automatically select one of a plurality of frequencies of operation of said tag in response to an interrogating rf field.

11. A controllable electronic resonator as claimed in claim 1 incorporated into an RFID tag or tag reader.

12. A controllable electronic resonator according to claim 1 wherein the transistor is configured to turn on and off according to a variable duty cycle; and wherein a response frequency of the resonant circuit is dependent on the duty cycle, and the response frequency of the resonant circuit automatically adjusts to a stimulus frequency.

13. A circuit as claimed in claim 12 wherein said variable duty cycle is controlled by a FET.

14. A circuit as claimed in claim 13 wherein the FET gate voltage is kept constant and the FET source voltage varies with the amplitude of the resonance, turning the FET on and off.

15. A circuit as claimed in claim 13 wherein the FET gate voltage is controlled with an external voltage source.

16. A circuit as claimed in claim 12 in a reader wherein the stimulus frequency is a sub-harmonic of a desired energizing field frequency.

17. A circuit as claimed in claim 12 in a reader wherein a crystal oscillator sets the operating frequency of the energizing field.

18. A circuit as claimed in claim 12 in a transponder.

19. A controllable electric resonator comprising a resonant circuit and a system for controlling the amplitude of oscillations on the resonant circuit, when the resonant circuit is driven by an oscillatory signal, the apparatus comprising:

means for applying a reactive element to said resonant circuit with a variable coupling; and means for varying said coupling over a cycle of said oscillatory signal to control said amplitude of oscillations, wherein the means for varying said coupling comprises a transistor having a gate terminal configured to receive a substantially constant voltage, a source terminal configured to receive a first resonance waveform of said resonant circuit and a drain terminal configured to receive a second resonance waveform of said resonant circuit, and the means for varying said coupling is for switching the transistor when a difference between said substantially constant voltage and said received first resonance waveform on said source terminal reaches a threshold voltage of the transistor, to thereby turn the transistor on and off during said cycle to vary said variable coupling over said cycle.

20. A method of controlling a resonant frequency of a resonant circuit of a controllable electric resonator to substantially match said resonant frequency to a frequency of an external waveform, the controllable electric resonator comprising an inductance coupled to a capacitance, the capacitance having a first component of capacitance and a second component of capacitance coupled to a field effect transistor (FET) switch, the method comprising:

turning on and off said FET switch during a period of oscillation of a signal on said resonant circuit to vary a total effective capacitance of said first and second components of capacitance, said turning on and off having a duty cycle that is a fraction of a period of oscillation of said resonant circuit; and controlling said duty cycle in response to a signal level of a waveform of an oscillation of said resonant circuit;

wherein the FET switch comprises a source arranged to receive a first resonance waveform of said resonant circuit, a drain arranged to receive a second resonance waveform of said resonant circuit and a gate arranged to receive a voltage that is substantially constant over said period of oscillation of said resonant circuit, and wherein said duty cycle controlling comprises providing a voltage between said gate and said source of said FET dependent upon an instantaneous level of said waveform of said oscillation of said resonant circuit such that the FET switches state when said voltage between said gate and said source reaches a threshold voltage of the FET.

21. A method as claimed in claim 20 wherein a relative phase of said waveform of said oscillation of said resonant circuit and of said external waveform changes responsive to a signal level of said external waveform.

22. A method as claimed in claim 20 wherein said external waveform comprises a waveform of an rf electromagnetic field.

23. A method as claimed in claim 22 further comprising and extracting energy from said resonant circuit.

24. A method as claimed in claim 23 wherein a relative phase of said waveform of said oscillation of said resonant circuit and of said external waveform changes responsive to as signal level of said external waveform, and wherein said relative phase adjusts to limit said extracted energy as said energy in said rf electromagnetic field increases.

25. A method as claimed in claim 20 wherein said external waveform comprises a waveform derived from a crystal oscillator.

26. A method as claimed in claim 25, further comprising outputting an rf signal derived from said oscillation of said resonant circuit to provide an rf signal source.

27. An apparatus comprising:
a resonant circuit and a system for automatically adjusting a resonant frequency of the resonant circuit when the resonant circuit is driven by an oscillatory signal;
means for applying a reactive element to said resonant circuit with a variable coupling; and
means for varying said coupling within a cycle of said oscillatory signal so as to change the resonant frequency of the resonant circuit.

28. A controllable electronic resonator including a circuit for controlling a resonant frequency of the resonator to substantially match said resonant frequency to a frequency of an external waveform, the resonator comprising an inductance coupled to a capacitance, the capacitance having a switched component of capacitance, the circuit comprising means for controlling a duty cycle of said switched component of capacitance in response to a signal level of a waveform of an oscillation of said resonator.

29. A controllable electronic resonator as claimed in claim 28, configured to extract energy from an rf electromagnetic field.

* * * * *